United States Patent [19]
Sicard et al.

[11] Patent Number: 5,945,730
[45] Date of Patent: Aug. 31, 1999

[54] SEMICONDUCTOR POWER DEVICE

[75] Inventors: Thierry Sicard, Cugnaux, France; Steve Charles Machuga, Deisenhofen; Conrad Monroe, Forstinning, both of Germany

[73] Assignee: Motorola, Inc., Schaumburg, Ill.

[21] Appl. No.: 09/019,292

[22] Filed: Feb. 5, 1998

[30] Foreign Application Priority Data

Feb. 12, 1997 [FR] France .................................. 97 01605

[51] Int. Cl.$^6$ ........................... H01L 23/495; H01L 5/06
[52] U.S. Cl. ........................ 257/666; 257/341; 257/342; 257/691; 257/207
[58] Field of Search ................................... 257/341, 342, 257/666, 691, 207

[56] References Cited

U.S. PATENT DOCUMENTS 3,697,828  10/1972  Oakes .................................. 317/235 R
5,801,432   9/1998  Rostoker et al. ....................... 257/666

FOREIGN PATENT DOCUMENTS 0720225  12/1995  European Pat. Off. ...... H01L 23/482
0724293   1/1996  European Pat. Off. ...... H01L 23/482
60-43947   3/1985  Japan .............................. H01L 29/80
2095904    2/1982  United Kingdom ............ H01L 23/48

Primary Examiner—Peter Toby Brown
Assistant Examiner—Hung Van Duong
Attorney, Agent, or Firm—Rennie William Dover

[57] ABSTRACT

A semiconductor power device comprises a metal conductor (6) coupled to a semiconductor region (30) of the device, one or more bumps (8) formed in contact with the metal conductor (6) and a frame (14) formed of high conductivity material. The frame (14) comprises a connecting portion (18) for connecting to at least one of the one or more bumps (8) so as to provide an external connection to the semiconductor region (30) of the device.

12 Claims, 5 Drawing Sheets

SEMICONDUCTOR POWER DEVICE

FIELD OF THE INVENTION

This invention relates to semiconductor power devices.

BACKGROUND OF THE INVENTION

In Lateral Double Diffused Metal Oxide (LDMOS) power transistors, the drain and source semiconductor regions are typically interdigitated regions extending across the LDMOS transistor die and the bonding pads are arranged around the periphery of the LDMOS transistor die. Final metal conductors extend across the drain and source semiconductor regions to connect the semiconductor regions to respective bonding pads.

Since some of the current must flow the length of the drain or source region to the bonding pad, such power transistors have a high on-resistance Rdson which is a significant part of the total device resistance. A high Rdson produces high power dissipation for high currents (15–20 A). Thus, in order to have high current capability, the packaging for such power transistors must be large enough to handle the power dissipation. In other words, by reducing the Rdson, the power transistor can support higher current applications at the same power dissipation level (or transistor area) or can provide lower power dissipation requiring smaller packaging.

Other lateral transistors, such as the TMOS* power transistors supplied by Motorola, Inc., are arranged in similar manner and suffer from the same problems.

*TMOS is a trademark of Motorola, Inc.

One solution to reduce the resistance of power devices, such as the LDMOS power transistor, is to have multiple wires bonded to the metal conductors over the semiconductor regions of the power device and to wire bond pads at the periphery of the die so as to reduce the length the current must flow in the metal conductors. Since the current capacity of each wire is limited by its width, a large number of wires are required to reach a high current capability in the region of 15–20 A. The additional bonding pads required for such a plurality of wires considerably increases the size of the power device. Moreover, the cost of manufacturing such a power device is extremely expensive, since each wire has to bonded individually. A further disadvantage of such an arrangement arises due to the fact that as current has to flow some distance through the wires, non-uniform hot spots are produced which reduces the device reliability.

Another solution utilises a thick layer of copper metal deposited on the die above the final metal conductors to reduce the resistance of the power device and replaces the plurality of wires by large aluminium wires bonded on the semiconductor regions. However, the additional deposition step of this solution increases the complexity and cycle time of the manufacturing process which adds significant cost to the integrated power device.

It is therefore an object of the invention to provide an improved semiconductor power device which mitigates the above mentioned problems.

SUMMARY OF THE INVENTION

In accordance with the present invention there is provided a semiconductor power device comprising:

a metal conductor coupled to a semiconductor region of the device;
   one or more bumps formed in contact with the metal conductor; and
   a frame formed of high conductivity material, the frame comprising a connecting portion for connecting to at least one of the one or more bumps so as to provide an external connection to the semiconductor region of the device.

BRIEF DESCRIPTION OF THE DRAWINGS

A semiconductor power device in accordance with the present invention will now be described, by way of example only, with reference to the accompanying drawings in which.

DETAILED DESCRIPTION OF THE DRAWINGS

The present invention will now be described with reference to a LDMOS power transistor device. It will however be appreciated that the invention can be applied to any power device where the resistance of the final metal influences the current capability of the device, for example devices having long final metal interconnects such as lateral power transistors.

Figure 1:
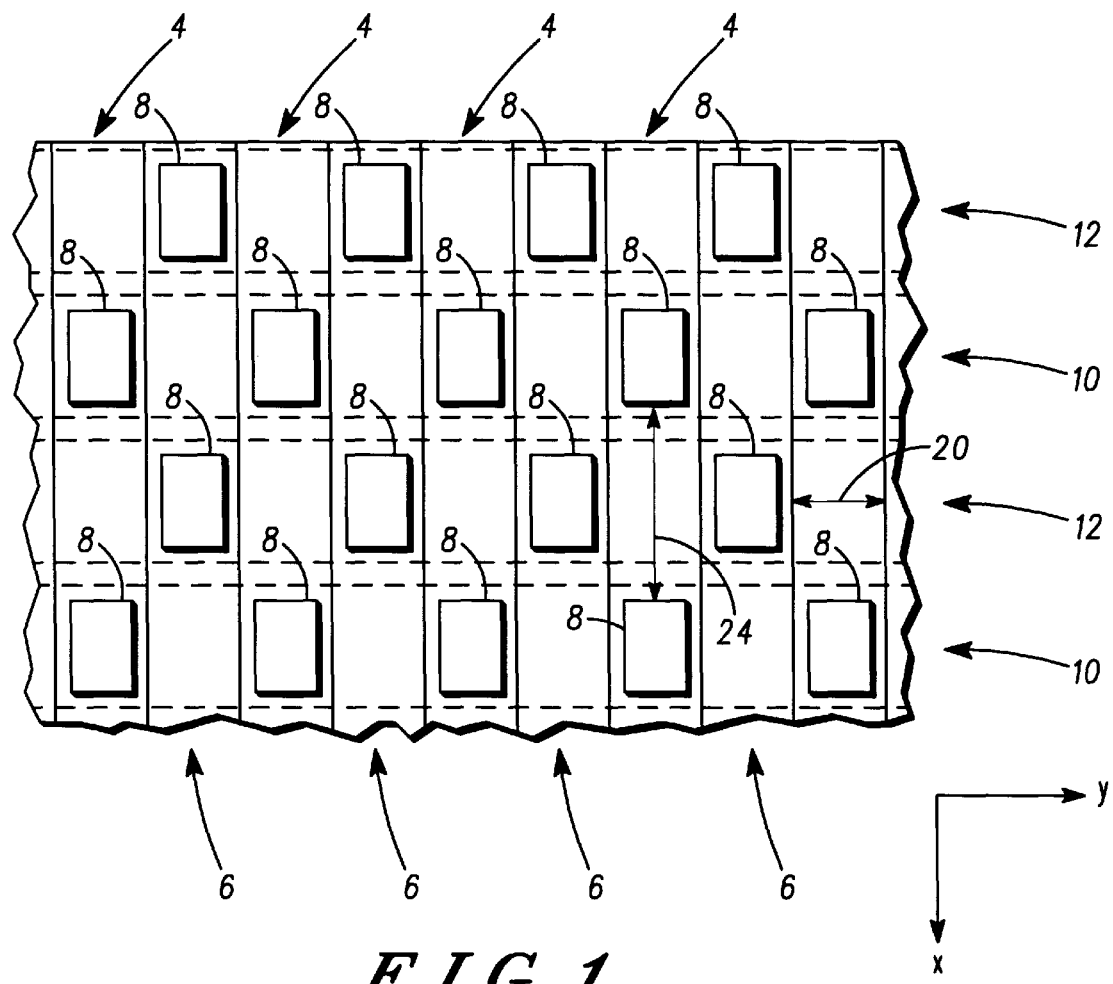
FIG. 1 is a top plan schematic diagram of part of a LDMOS transistor die in accordance with the present invention.

A LDMOS power transistor device in accordance with a preferred embodiment of the present invention comprises a LDMOS transistor die, part 2 of which is shown in FIG. 1. Alternating metal conductors 4 and 6 extend over and are coupled to drain and source semiconductor regions respectively (not shown) of the LDMOS transistor die. For each of the drain 4 and source 6 metal conductors, one or more bumps 8 are formed in contact therewith. Each bump 8 is formed of a metal, such as copper, or an alloy, such as an alloy of copper, tin and lead. FIG. 1 does not show all the drain 4 and source 6 metal conductors and shows only two bumps on each of the metal conductors 4 and 6. It will however be appreciated that a plurality of bumps may be arranged over the whole length of each of the metal conductors 4 and 6 or only one bump may be arranged on each of the metal conductors 4 and 6. Moreover, instead of having alternating or interdigitated metal conductors 4 and 6, the power transistor device may have non-alternating conductors or even one drain conductor only and one source conductor only.

Figure 2:
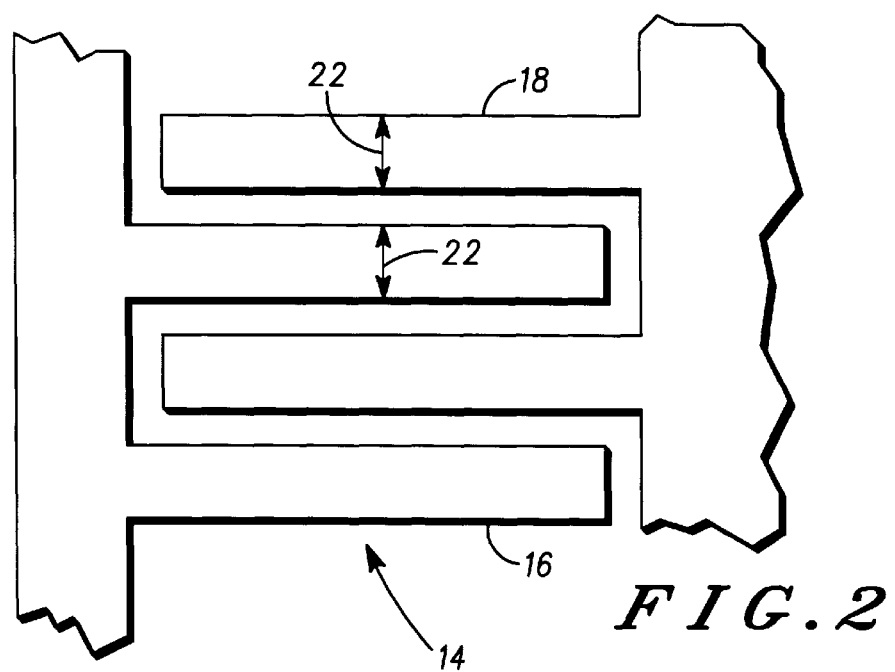
FIG. 2 is top plan view of part of a frame of a LDMOS transistor device in accordance with the present invention.

With reference now also to FIG. 2, the LDMOS transistor device in accordance with the preferred embodiment of the present invention further comprises a frame, only part 14 of which is shown in FIG. 2, formed of high conductivity material.

In the preferred embodiment, the frame comprises a plurality of first connecting portions 16 for coupling to the drain metal conductors 4 via the respective bumps 8 and a plurality of second connecting portions 18 for coupling to the source metal conductors 6 via the respective bumps 8. The first 16 and second 18 connecting portions provide an external connection to the drain and source semiconductor regions respectively. The particular number and arrangement of the connecting portions of the frame depend on the number of metal conductors, the number of bumps on each metal conductor and the spatial arrangement of the bumps. This will become more apparent from the following.

Figure 3:
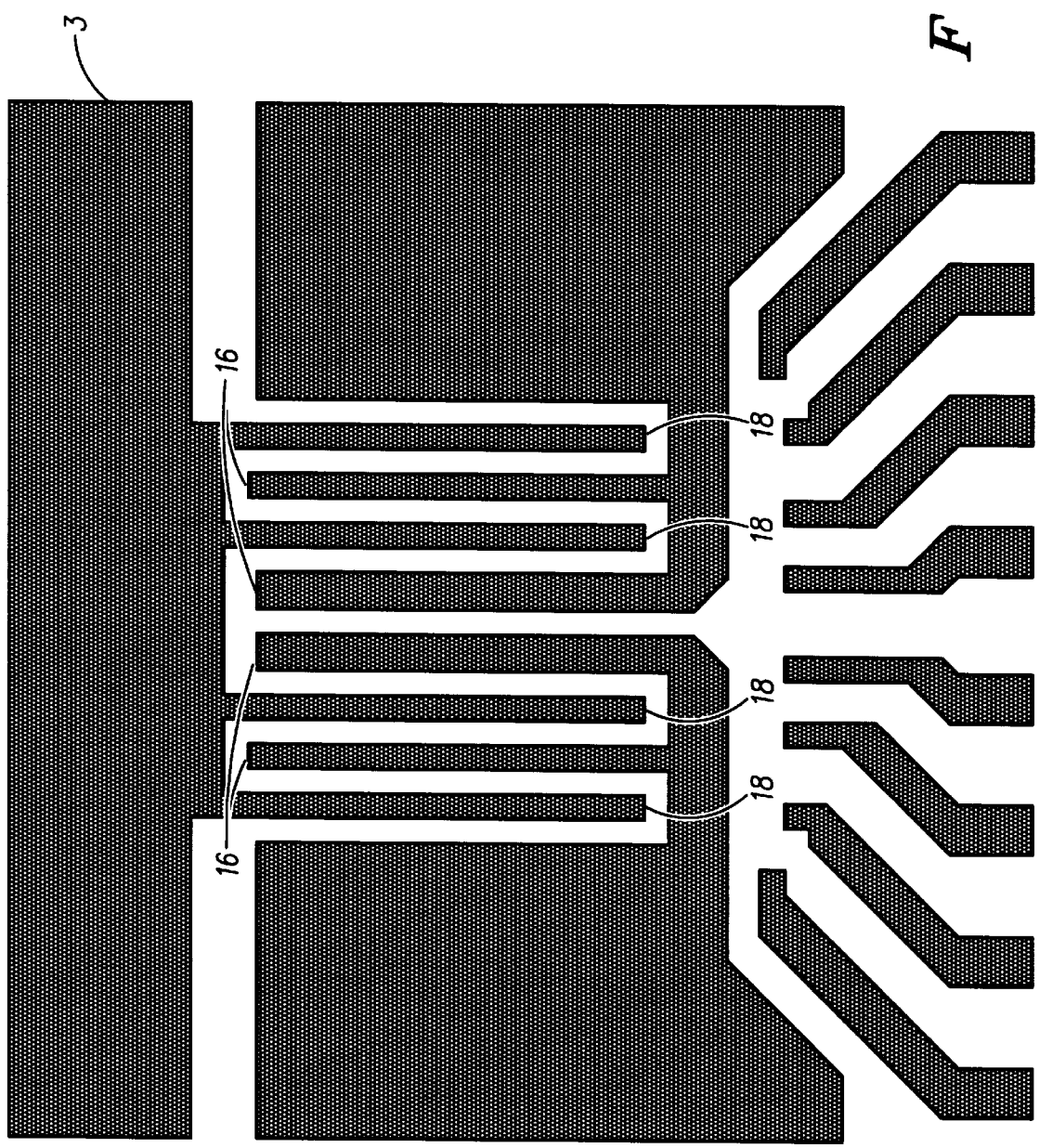
FIG. 3 is a top plan view of a whole frame of a LDMOS transistor device in accordance with the present invention.

When the LDMOS transistor device is assembled, the frame extends over the metal conductors 4 and 6 of the LDMOS transistor die so that the connecting portions 16, 18 are connected to the respective metal conductors via the respective bumps. In addition, to providing connections to the semiconductor regions of the device, the frame also is the lead frame of the device and so provides a support for the LDMOS transistor die. FIG. 3 shows an example of a whole frame 3 in accordance with an embodiment of the present invention. Like components to those of FIG. 2 are referred to by the same reference numeral.

Preferably, the frame comprises a copper pattern, having copper connecting portions 70 microns thick and 200 microns wide (width 22), formed on a polymer tape substrate. The backside of the tape substrate can be attached to the final product via reflow soldering.

In the embodiment shown in FIG. 1, the drain 4 and source 6 metal conductors are arranged in parallel in a first direction X. The bumps 8 on the drain metal conductors 4 are arranged so that they are aligned in first lines 10 which extend in a second direction Y. The bumps 8 on the source metal conductors 6 are arranged so that they are aligned in second lines 12 which extend in the second direction Y. In FIG. 1, the second direction Y is shown to be substantially perpendicular to the first direction X.

Figure 4:
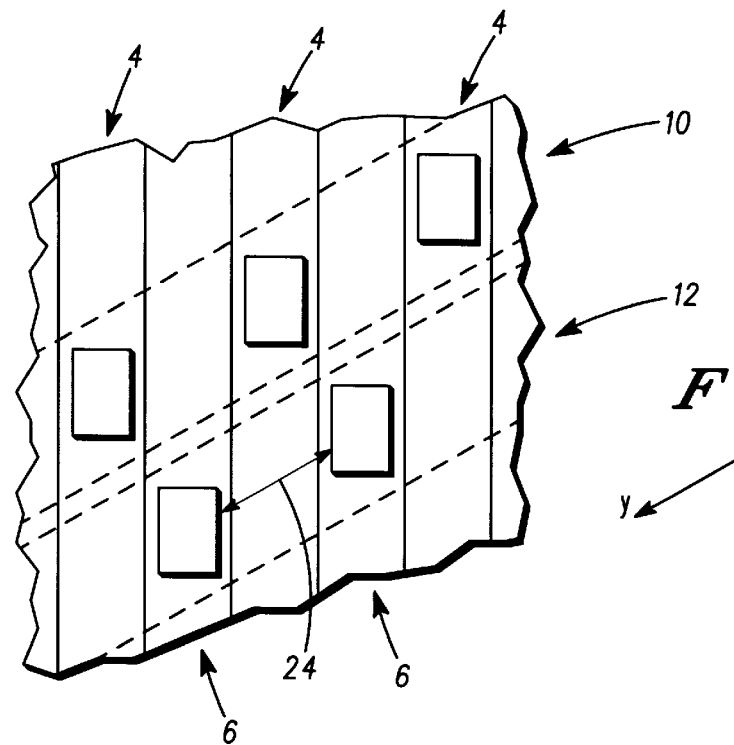
FIG. 4 is a top plan schematic diagram of part of a LDMOS transistor die in accordance with a second embodiment of the present invention.

The bumps may alternatively be arranged on the drain 4 and source 6 metal conductors so that they are aligned in the first 10 and second 12 lines respectively, which lines extend in a second direction Y which is skewed with respect to the first direction as shown in FIG. 4.

In the preferred embodiment of the invention, the connecting portions 16 and 18 of the frame are arranged so that when the die and frame are assembled, each connecting portion (extends over a respective one of the first 10 and second 12 lines in the Y direction (e.g. FIG. 1 or FIG. 4). This means that the longest current path is equal to half the distance 24 between adjacent bumps along a respective metal conductor. For bumps separated by a distance of 400 microns, this means that the longest current path is 200 microns. Thus, the smaller the separation distance 24 between the bumps, the lower the Rdson of the device. However, the size of the separation distance 24 is limited by how narrow the connecting portions 16, 18 can be produced.

Figure 5:
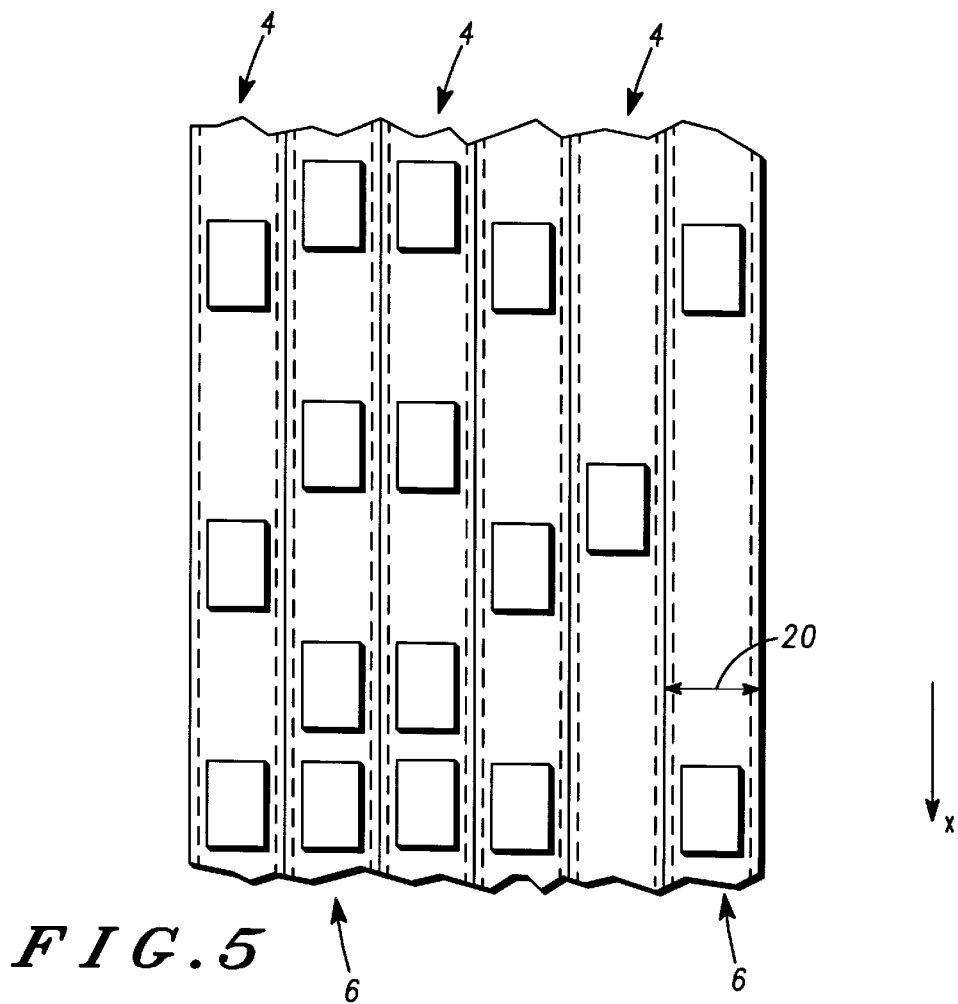
FIG. 5 is a top plan schematic diagram of part of a LDMOS transistor die in accordance with a third embodiment of the present invention.

In FIG. 5, the bumps 8 are arranged randomly between the metal conductors 4 and 6. In this particular arrangement, the frame is arranged so that the first 16 and second 18 connecting portions of the frame, when assembled, extend along respective metal conductors in the first direction X as shown by the dotted lines. The first 16 and second 18 connecting portions of the frame may also be arranged to extend along the respective metal conductors in the first direction X for the ordered bump arrangement shown in FIG. 1. Having the connecting portions oriented along the X direction is however harder to implement as there can be problems in providing connecting portions 16 and 18 which are narrow enough. The width 20 of each of the metal conductors 4 and 6 is the same and in the preferred embodiment is approximately 80 microns. This means that connecting portions 16 and 18 must be less than 80 microns wide for this embodiment.

Figure 6:
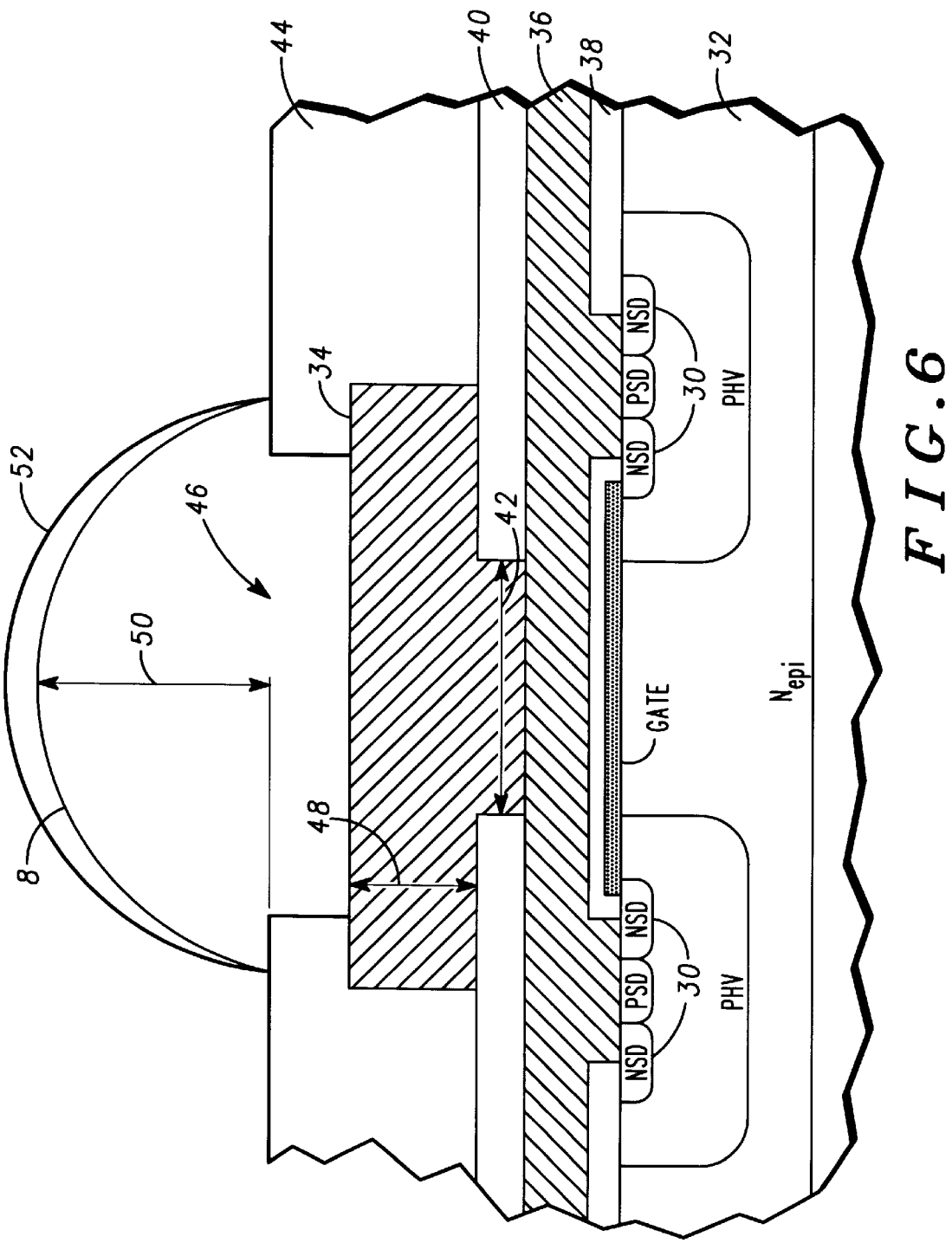
FIG. 6 is a cross-sectional schematic diagram of part of a LDMOS transistor die in accordance with the present invention.

FIG. 6 is a cross-sectional view of part of a LDMOS transistor die in accordance with the present invention showing one of the bumps 8 in contact with a metal conductor 34 coupled to semiconductor regions 30. The bump 8 shown in FIG. 6 may be any one of the bumps in FIGS. 1, 4 or 5. For example, the metal conductor 34 may be one of the source conductors 6 and the semiconductor regions 30 the source semiconductor regions.

The source semiconductor regions 30 are formed in an epitaxial region 32 in a manner well known in the art. A first metal layer 36 is formed on the epitaxial region 32 and an oxide layer 38. A second oxide layer 40 is formed over the first metal layer 36 and is patterned and etched to provide an opening 42 to the first metal layer 36. A second metal layer is deposited on the second oxide layer 40 to form the metal conductor 34. A passivation layer 44 is then formed over the second oxide layer 40 and part of the metal conductor 34 so as to provide an opening 46. The bump 8 is then formed in the opening 46. Preferably, the metal conductor 34 (extends a distance 48 of 2 microns above the second oxide layer 40 and the bump 8 extends a distance 50 of 35 microns above the passivation layer 44.

Figure 7:
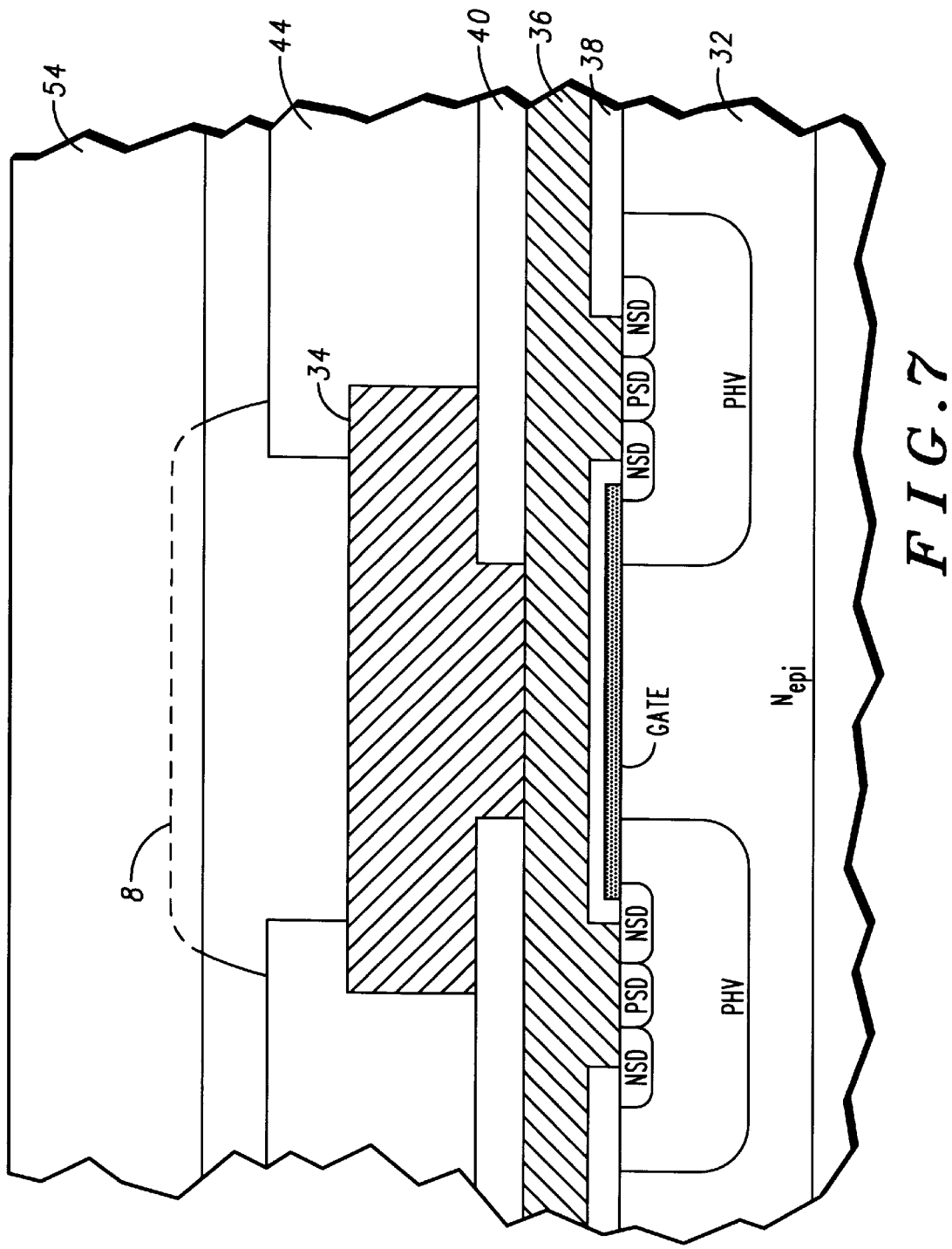
FIG. 7 is a cross-sectional schematic diagram of the part shown in FIG. 6 when coupled to part of the frame of the LDMOS transistor device in accordance with the present invention.

In order to couple the frame to the bumps 8, solder 52 may be applied on top of the bump 8 as shown in FIG. 6 or to the frame itself. On assembly, the frame is placed on top of the die so that each connecting portion, connection portion 54 of FIG. 7, is in contact with the respective bumps or bump 8. Metallurgical bonds are therefore formed on both sides of the bump 8. The LDMOS transistor device is then encapsulated.

As mentioned above, preferably the frame is formed of a thick metal which, through the connecting portions, are used to form the metal interconnections to the device semiconductor regions. By utilising thick metal or any other material of high conductivity and also bumps spread across the metal conductors on the semiconductor regions, the resistance of the final metal interconnects can be significantly reduced and hence the Rdson can be considerably reduced. For example, the known plurality of wire bonds arrangement mentioned above has a Rdson of approximately 77 mohms whereas the device in accordance with the present invention has a Rdson of approximately 35 mohms.

This significant reduction in the device resistance ensures that the power device in accordance with the present invention can sustain higher currents, in the order of 15–20 A, for the same power level (or transistor area) compared to the prior art arrangements. This is particularly useful in applications requiring the integration of logic and power devices on the same chip with continuous operation at power levels of above 5 A.

Furthermore, the resistance of the device can be varied by simply varying the spread or thickness of the connecting portions 16, 18 or by varying the bump pattern.

The connecting portions of the present invention are made as part of the frame or lead frame of the device. This means that the connections to the semiconductor regions can be performed by a simple assembly step and without the need for wire bonds. The present invention is therefore simple to manufacture and provides significant die size reductions since it avoids the need for wire bond pad areas. Moreover, the present invention does not require an expensive third thick metal deposition process as used in the prior art arrangement mentioned in the introduction.

The present invention also allows for more efficient heat dissipation through the short, relatively large area (compared to wire bonding) bumps bonded directly to the sources of the heat on the active face of the device, through the metal intensive connecting portions of the frame to the product level printed circuit board. Additionally, the present invention allows access to the backside of the LDMOS device for additional power dissipation.

We claim:

1. A semiconductor power device comprising:

first and second semiconductor regions, a plurality of first metal conductors coupled to the first semiconductor region, each of the plurality of first metal conductors having at least one bump in contact therewith, a plurality of second metal conductors coupled to the second semiconductor region, each of the plurality of second metal conductors having at least one bump in contact therewith, and a frame formed of high conductivity material, the frame comprising a plurality of first connection portions for connecting to the at least one bumps of the first metal conductors and a plurality of second connection portions for connecting to the at least one bumps of the second metal conductors, the frame providing external connections to the semiconductor regions of the device.

2. A semiconductor power device according to claim 1 wherein the plurality of first metal conductors are interdigitated with the plurality of second metal conductors.

3. A semiconductor power device according to claim 1 wherein each of the plurality of first and second metal conductors are arranged in parallel extending in a first direction.

4. A semiconductor power device according to claim 1 wherein each of the plurality of first metal conductors have a plurality of bumps in contact therewith and wherein each of the plurality of second metal conductors have a plurality of bumps in contact therewith.

5. A semiconductor power device according to claim 1 wherein each of the plurality of first and second metal conductors are arranged in parallel extending in a first direction and wherein each of the plurality of first and second metal conductors have a plurality of bumps arranged along the respective metal conductor in the first direction, such that the bumps on the first metal conductors are substantially aligned in first lines which extend in a second direction and such that the bumps on the second metal conductors are substantially aligned in second lines which extend in the second direction.

6. A semiconductor power device according to claim 5 wherein the second direction is substantially perpendicular to the first direction.

7. A semiconductor power device according to claim 5 wherein the second direction is skewed to the first direction.

8. A semiconductor power device according to claim 5 wherein the second lines alternate with the first lines.

9. A semiconductor power device according to claim 5 wherein the frame has a plurality of first connection portions, each of the first connection portions for connecting to the bumps arranged in a respective one of the first lines extending in the second direction and each of the second connection portions for connecting to the bumps arranged in a respective one of the second lines extending in the second direction.

10. A semiconductor lateral power transistor device comprising:

drain and source semiconductor regions;

a plurality of drain metal conductors coupled to the drain semiconductor region and extending in a first direction, each of the plurality of drain metal conductors having a plurality of the bumps in contact therewith and arranged along the respective drain metal conductor in the first direction, such that the bumps on the drain metal conductors are substantially aligned in first lines which extend in a second direction;

a plurality of source metal conductors coupled to the source semiconductor region and extending in parallel with the plurality of drain metal conductors in the first direction, each of the plurality of source metal conductors having a plurality of the bumps in contact therewith and arranged along the respective source metal conductor in the first direction, such that the bumps on the source metal conductors are substantially aligned in second lines which extend in the second direction; and a frame formed of high conductivity material, the frame comprising a plurality of first and second connection portions, each of the first connection portions for connecting to the bumps arranged in a respective one of the first lines extending in the second direction and each of the second connection portions for connecting to the bumps arranged in a respective one of the second lines extending in the second direction, wherein the first and second connecting portions provide external connections to the drain and source semiconductor regions of the device.

11. A semiconductor lateral power transistor device according to claim 10 wherein the second direction is substantially perpendicular to the first direction.

12. A semiconductor lateral power transistor device according to claim 10 wherein the second direction is skewed to the first direction.

* * * * *